United States Patent
Priel et al.

(10) Patent No.: US 9,500,679 B2
(45) Date of Patent: Nov. 22, 2016

(54) SYSTEM AND METHOD FOR ON-DIE VOLTAGE DIFFERENCE MEASUREMENT ON A PASS DEVICE, AND INTEGRATED CIRCUIT

(75) Inventors: Michael Priel, Netanya, IL (US); Leonid Fleshel, Hertzelia, IL (US); Sergey Sofer, Rishon Lezion, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/415,151

(22) PCT Filed: Jul. 19, 2012

(86) PCT No.: PCT/IB2012/053682
§ 371 (c)(1),
(2), (4) Date: Jan. 16, 2015

(87) PCT Pub. No.: WO2014/013293
PCT Pub. Date: Jan. 23, 2014

(65) Prior Publication Data
US 2015/0204917 A1    Jul. 23, 2015

(51) Int. Cl.
*G01F 15/06* (2006.01)
*G01R 19/10* (2006.01)
*G01R 31/28* (2006.01)

(52) U.S. Cl.
CPC ........... *G01R 19/10* (2013.01); *G01R 31/2856* (2013.01)

(58) Field of Classification Search
CPC .. G01S 17/325; G01S 17/4916; G01S 17/58; H03L 7/1976; H03L 7/085
See application file for complete search history.

(56) References Cited

U.S. PATENT DOCUMENTS

| | | | |
|---|---|---|---|
| 5,990,673 A | 11/1999 | Forsberg | |
| 6,359,809 B1* | 3/2002 | Tedrow | G11C 16/30 365/185.21 |
| 6,933,739 B1 | 8/2005 | Rosen | |
| 7,250,783 B2 | 7/2007 | Hsu et al. | |
| 7,443,187 B2 | 10/2008 | Jenkins et al. | |
| 2005/0140418 A1* | 6/2005 | Muniandy | G06F 1/04 327/291 |
| 2007/0024270 A1 | 2/2007 | Kawamura | |
| 2008/0303526 A1 | 12/2008 | Itskovich et al. | |
| 2009/0128095 A1 | 5/2009 | Masson et al. | |
| 2011/0279149 A1 | 11/2011 | Maheshwari | |

OTHER PUBLICATIONS

International Search Report and Written Opinion correlating to PCT/IB2012/053682 dated Feb. 21, 2013.

* cited by examiner

Primary Examiner — Sibin Chen

(57) ABSTRACT

A system for on-die voltage difference measurement on a pass device comprises a first voltage controlled oscillator circuit having a first voltage control input connectable to a first terminal of the pass device; a second voltage controlled oscillator circuit having a second voltage control input connectable to a second terminal of the pass device; a first counter circuit arranged to count oscillation periods of a first output signal from the first voltage controlled oscillator circuit and to provide a stop signal when a predefined number of the oscillation periods of the first output signal is counted; and a second counter circuit arranged to count oscillation periods of a second output signal from the second voltage controlled oscillator circuit and to stop counting depending on the stop signal.

12 Claims, 4 Drawing Sheets

SYSTEM AND METHOD FOR ON-DIE VOLTAGE DIFFERENCE MEASUREMENT ON A PASS DEVICE, AND INTEGRATED CIRCUIT

FIELD OF THE INVENTION

This invention relates to a system and a method for on-die voltage difference measurement on a pass device, and to an integrated circuit.

BACKGROUND OF THE INVENTION

Integrated circuits connected to a power supply consume power while being in use or on-line. An estimation of the current flowing through the integrated circuit or a portion of the integrated circuit or module or device on the integrated circuit die is an important factor for validation of the integrated circuit. On-line current estimation, i.e., estimation of the current during operation of the integrated circuit, on supply lines which provide power from a power supply connected to power supply pins of the integrated circuit to the circuit or regions or modules of the circuit is an important aspect of validation and power management of the integrated circuit. Power management may, for example, be applied in the case of multiple gated power domains. On-line current estimation may influence, for example, optimization of software for employing the integrated circuit. An integrated circuit may, for example, comprise a processing device.

In U.S. Pat. No. 6,933,739, an integrated circuit is described wherein absolute values of voltage, temperature and silicon quality at certain locations on an integrated circuit die are determined by means of testing devices, such as ring oscillators, placed at the various locations.

In U.S. Pat. No. 7,443,187, a technique for on-chip detection of integrated circuit power supply noise is described wherein monitored signals on integrated circuit power supply lines are voltage level shifted and compared with a voltage of a reference power supply line using analogue comparator circuits.

In U.S. Pat. No. 7,250,783, leakage current in electronic devices, such as microprocessors, is measured in multiple locations on the integrated circuit die using a current mirror multi-channel leakage current monitor circuit.

In JP 06-148264, a measuring method for leakage current of an integrated circuit device is presented. To determine accepted or rejected products, a resistance and a relay are connected in series with a power supply pin and a comparator for evaluating voltage drops caused by leakage current. The method allows for externally measuring overall leakage current.

SUMMARY OF THE INVENTION

The present invention provides a system and a method for on-die voltage difference measurement on a pass device, and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 1:
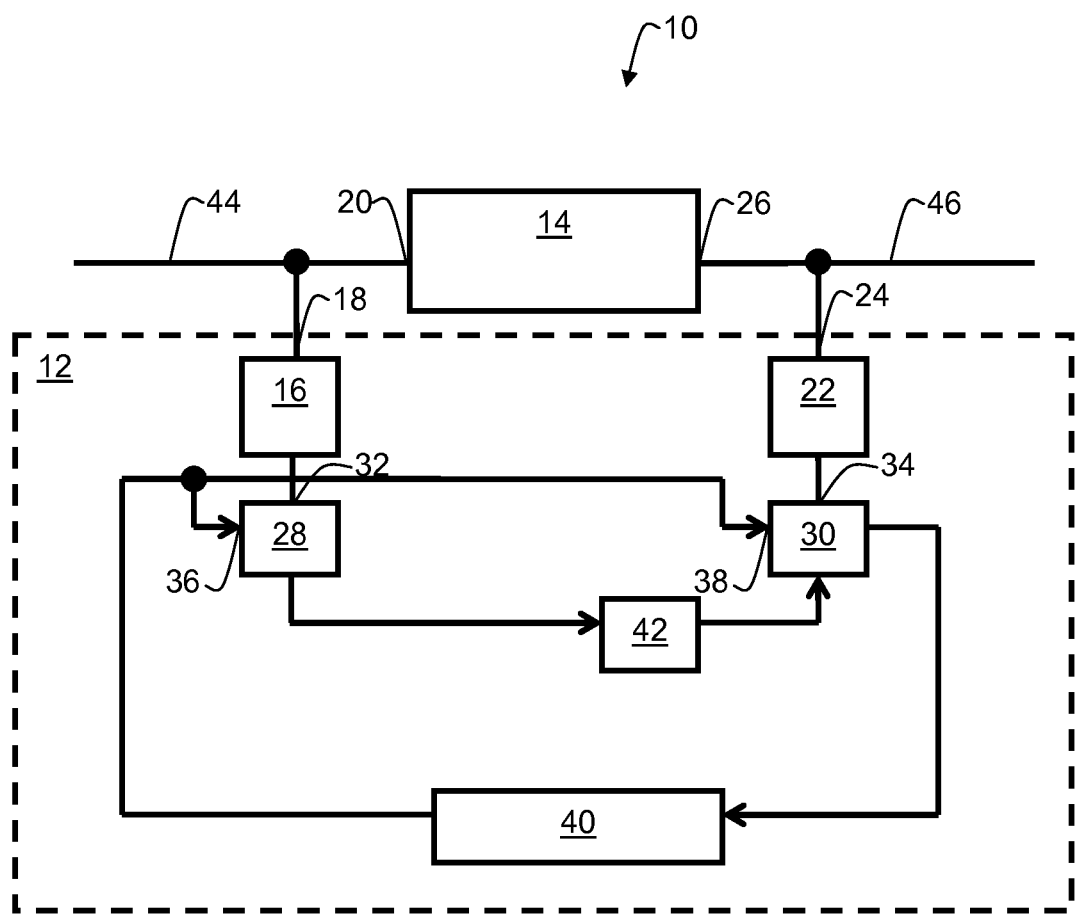
FIG. 1 schematically shows a block diagram of an example of an embodiment of an integrated circuit comprising an embodiment of a system for on-die voltage difference measurement on a pass device.

Referring to FIG. 1, a block diagram of an example of an embodiment of an integrated circuit 10 is show. The integrated circuit 10 comprises a pass device 14 and a system 12 for on-die voltage difference measurement on the pass device 14, as described below.

The example of a system 12 for on-die voltage difference measurement on a pass device 14 shown in FIG. 1 comprises a first voltage controlled oscillator (VCO) circuit 16 having a first voltage control input 18 connectable to a first terminal 20 of the pass device 14; a second voltage controlled oscillator circuit 22 having a second voltage control input 24 connectable to a second terminal 26 of the pass device 14; a first counter circuit 28 arranged to count oscillation periods of a first output signal from the first voltage controlled oscillator circuit 16 and to provide a stop signal when a predefined number of the oscillation periods of the first output signal is counted; and a second counter circuit 30 arranged to count oscillation periods of a second output signal from the second voltage controlled oscillator circuit 22 and to stop counting depending on the stop signal.

The shown system 12 may, for example, allow estimating current through the pass device 14 by determining a voltage drop between the first and second terminals 20, 26 across the pass device 14 even though the voltage difference may be very small, i.e., without relying on measuring high voltage differences. For accurate measuring, the system 12 may be located on-die, i.e. on the same integrated circuit die as the pass device 14. A system for measuring voltage differences which can be applied to small voltage differences may, for example, have no or only reduced impact on process reliability, power consumption and thermal dissipation of the integrated circuit 10 having the pass device 14. The first 20 and second 26 terminals may, for example, be an input terminal and an output terminal of the pass device 14, e.g., directly or indirectly connected or connectable to a power supply of the integrated circuit 10.

The integrated circuit 10 may be any integrated circuit, e.g., where current consumption is a relevant parameter, and may, for example, comprise a microprocessor, a graphics processing unit or a microcontroller unit, a memory device or other type of logic circuit, etc. The pass device 14 may, for example, be a power switch of such an integrated circuit or any other type of pass device suitable to control power supplied to (a part of) the integrated circuit, such as a power gating switch controlling power provided to a power gated domain of an integrated circuit.

A VCO circuit may be an electronic oscillator circuit wherein an oscillation frequency of its output signal is controllable by a level of a voltage received at a voltage control input of the VCO circuit. The frequency of oscillation may be varied at least by the DC level of the voltage applied to the voltage control input.

The first and second voltage controlled oscillator circuits 16, 22 may be ring oscillator circuits. A ring oscillator circuit may be circuit composed of an odd number of inverter circuits or NOT gates wherein the inverters are connected in a chain, i.e., an output of an inverter is fed as an input into a subsequent inverter in the chain. The chain is connected in a loop or ring, i.e., the output of the last inverter of the chain is fed back as input into the first inverter of the chain. The output of the ring, i.e., the output of the last inverter in the chain may oscillate between two voltage levels corresponding to "true" and "false" states of the logic NOT gates. Ring oscillator circuits may be built with high linearity of frequency dependence on their supply voltage. The first and second VCO circuits 16, 22 may be a ring oscillator pair. The first and second voltage control inputs 18, 22 may be supply voltage inputs for the inverters of the first and second ring oscillators.

The first and second voltage controlled oscillator circuits 16, 22 may be implemented and arranged such that both VCO circuits provide, from an operational viewpoint identical operation characteristics or very similar in the sense that in the respective applications the differences do not result in a noticeable change of the performance of the system 12.

The first voltage controlled oscillator circuit 16 may, for example, at least comprise a first circuit portion built together with a second circuit portion of the second voltage controlled oscillator circuit 22 using a layout matched circuit design technique. For example, devices of both VCO circuits, such as some or all inverters of both ring oscillator circuits, may be built close together in a common die area in order to built VCO circuits matching each other in that they share identical or very similar physical characteristics and provide identical or very similar voltage/frequency-characteristics.

Each of the first and second VCO circuits 16, 22 may receive a dedicated clock signal which may or may not be provided by a common clock signal source. The received clock signals may or may not be the same clock signal.

The first VCO circuit 16 may have the first voltage control input 18 connected to the first terminal 20 of the pass device 14 and a first signal output connected to a first signal input 32 of the first counter circuit 28, whereas the second VCO circuit 22 may have its voltage control input, i.e., the second voltage control input 24 connected to the second terminal 26 of the pass device 14 and a second signal output connected to a second signal input 34 of the second counter circuit 30. The first counter circuit 28 may comprise a first start signal input 36 and the second counter circuit may comprise a second start signal input 38. Each of the counters may start counting oscillation periods of the signal received at their first and second signal input 30, 32, respectively. Start of counting may be accompanied with a prior reset of the current counter value to a predefined initial value. The initial value may be common to both the first and the second counter circuits 28, 30.

The first counter circuit 28 and the second counter circuit 30 may be arranged to receive a same start signal, i.e., both the first and the second counter circuit 28, 30 may be arranged to receive a trigger signal for start of counting, at least virtually, at the same time. As shown in FIG. 1, the first and the second start signal input 36, 38 may be connected to a common signal line for receiving the start signal, for example, from a control unit 40.

The first counter circuit 28 and the second counter circuit 30 may, for example, be ripple counter circuits, i.e., asynchronous counters implemented, for example, using JK flip flops. Ripple counters may be operated at low frequencies as well as at very high frequencies and may be suitable for counting oscillation periods at, for example, several GHz, e.g. 4 GHz.

The first counter circuit 28 may be arranged to count a predefined amount or number of oscillation periods of the first output signal. Depending on a desired size of analysis window, which may be defined by the number of oscillation periods to be counted, the number may, for example, be 100 or 1000 oscillation periods or cycles of the first output signal. The first counter circuit may provide the stop signal or counting completion signal when the predefined number of the oscillation periods of the first output signal has been counted. The first counter circuit 28 may be connected to the second counter circuit 30 which may be arranged to count oscillation periods of a second output signal from the second voltage controlled oscillator circuit 22 and to stop counting depending on the stop signal, e.g. stop counting when the stop signal is issued or a predetermined time thereafter. The second counter circuit 30 may be connected to receive the stop signal or counting completion signal from the first counter circuit 28 via a connecting line.

The second counter circuit 30 may, for example, receive the stop signal issued by the first counter signal directly. The stop of the second counter circuit 30 may be triggered directly by the stop signal, i.e., without prior synchronization of the stop signal to the clock signal of the second VCO circuit. This may avoid introducing any synchronization delay. Since variation between clock signals provided to the first and second voltage controlled oscillator circuits 16, 22 may be zero or very small, the counter value of the second counter circuit 30 after receiving the stop signal may be accurate.

In an embodiment of the system 12, the control module 40 may be arranged to repeat measurements several times. This may result in generating a set of second counter values, for example three, and a correct second counter value may be selected from the set, for example, by means of a majority decision.

In another embodiment of the system 12 the stop signal may be provided from the first counter circuit 28 to the second counter circuit 30 via a connection comprising a synchronization circuit 42. The synchronization circuit 42 may be triggered by the same clock signal as the second VCO circuit. It may, for example, comprise a plurality of flip-flop circuits, such as two flip-flop circuits which may provide a synchronized stop signal which may disable counting of the second counter circuit 30. This may avoid a possibly inaccurate counter value and may introduce a synchronization error of one cycle of the synchronizing clock which may aggregate to 2 cycles, depending on difference calibration and the actual measurement.

The system may comprise the control unit 40 arranged to receive a counter value of the second counter circuit 30 when the second counter circuit 30 stops counting. In case of the first and second VCO circuits 16, 30 having identical characteristics and taking into account a possible counter delay introduced by the synchronization circuit 42, the counter value of the second counter circuit 30 when receiving the stop signal will be the same as the counter value of the first counter circuit 28, which corresponds to the predefined number of oscillation periods, if a voltage level at the first terminal 20 is the same as the voltage level at the second terminal 26 of the pass device 14. Otherwise, the difference of the second counter value to the first counter value, i.e., the difference to the predefined number of oscillation periods, may be an indicator for a voltage difference between the terminals 20, 26. The control unit 40 may be arranged to determine from the counter value of the second counter circuit 30 a voltage difference between the first terminal 20 and the second terminal 26. In case of a linear dependency between input voltages and frequency of the first and second output signals, the detected difference may be linearly transferable into the detected voltage difference. The control unit 40 may, for example, be arranged to transmit the counter value of the second counter circuit 30 to an evaluation unit or may be arranged to determine the voltage difference by itself. And it may be arranged to determine from the voltage difference a current flow in the pass device 14. The control unit 40 may, for example, be a processing device or a module of a processing device or may be connectable to a processing device.

The control unit 40 may be arranged to determine the voltage difference, i.e. the difference between voltages at the first and second terminals 20, 26, depending on an offset value between the first counter circuit 28 and the second counter circuit 30. The offset value may refer to a permanent offset between the first and second counter values. It may, for example, be determined by measuring the voltage difference while no current flowing through the pass device 14. This may be achieved, for example, by switching off the pass device 14 or current consuming circuitry connected to the pass device. If a synchronization circuit 42 is used, the offset value may additionally comprise the introduced synchronization delay. The offset value may be used for calibrating the counter value of the second counter circuit 30 and may be determined, e.g., by one or a plurality of measurements, such as three measurements, when no current flows through the pass device 14.

The first terminal 20 and the second terminal 26 may be connected to supply lines 44, 46 of the pass device 14. Supply lines may connect the pass device 14 to a power supply or ground for example. A first current terminal of the pass device may for example be connected to a first supply line 44 which connects the pass device to a high voltage side, and a second current terminal of the pass device may for example be connected to a second supply line 46 which connects the pass device to a low voltage side, and the pass device having a control input (not shown) via which the power passing between the current terminals can be controlled. The low voltage side may for example be a power gated domain. A voltage difference between the first and second terminals 20, 26 of the pass device may allow to estimate the current through the pass device 14. The supply lines 44, 46 may, for example, be directly connected to pins of the integrated circuit 10.

The presented system is also suitable for integrated circuits wherein the first and second terminals 20, 26 of the pass device 14 may not be exposed to pins of the integrated circuit 10, i.e., may not be directly connected to power supply pins of the integrated circuit, but may be terminals of an internal circuit or module of the integrated circuit. For example, an integrated circuit may comprise gated power domains on-die which may be selectively connectable or disconnectable from a power supply by power gates or power switches. The pass device 14 itself may, for example, be a power switching device or power switch.

Figure 2:
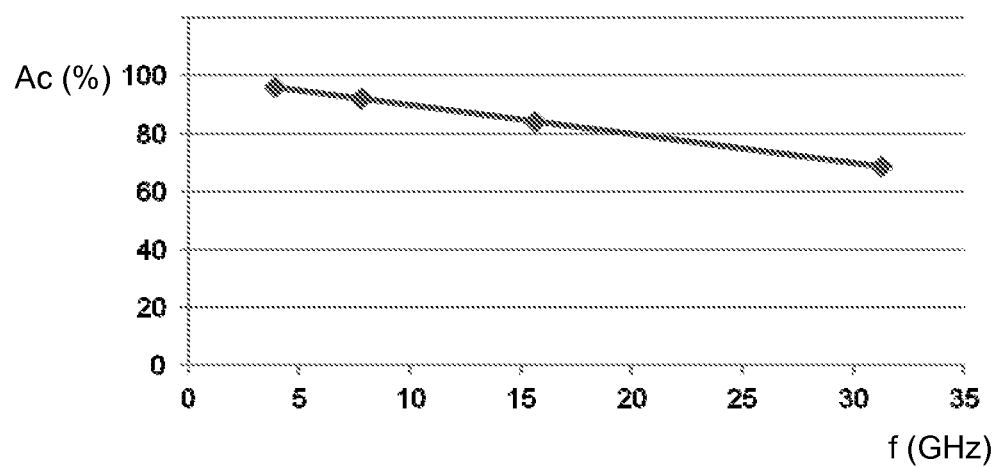
FIG. 2 schematically shows an example diagram of measurement accuracy versus sampling frequency when counting oscillation periods.

Referring to FIG. 2, an example diagram of measurement accuracy Ac in % versus sampling frequency f in GHz when counting oscillation periods is schematically shown. f may be the frequency at which the output signal from the second VCO circuit is sampled in order to detect its oscillation periods. In the shown example, the oscillator frequency of the second output signal is assumed to be 4 GHz which may easily be handled when using, for example, a ripple counter for counting. It can be seen that for a given predefined number of oscillation periods to be counted, a trade-off exists between the time of measurement and the achievable accuracy of measurement. The averaging window given by the predefined number of oscillation periods to be counted by the first counter circuit may be selected such as to minimize possible synchronization uncertainty.

Figure 3:
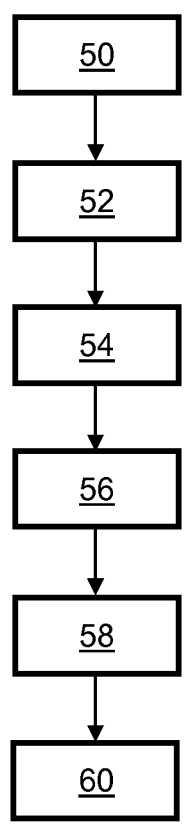
FIG. 3 schematically shows a flowchart of a first example of an embodiment of a method for on-die voltage difference measurement on a pass device.

Referring to FIG. 3, a flowchart of a first example of an embodiment of a method for on-die voltage difference measurement on a pass device is schematically shown. The method shown in FIG. 3 allows implementing the advantages and characteristics of the described system as part of a method for on-die voltage difference measurement on a pass device. The method comprises providing 50, by a first voltage controlled oscillator circuit connected to a first terminal of the pass device, a first output signal to a first counter circuit; providing 52, by a second voltage controlled oscillator circuit connected to a second terminal of the pass device, a second output signal to a second counter circuit; counting 54, by the first counter circuit, oscillation periods of the first output signal; counting 56, by the second counter circuit, oscillation periods of the second output signal; providing 58 a stop signal to the second counter circuit when a predefined number of the oscillation periods of the first output signal is counted; and stop counting 60 of the second counter circuit depending on the stop signal.

Figure 4:
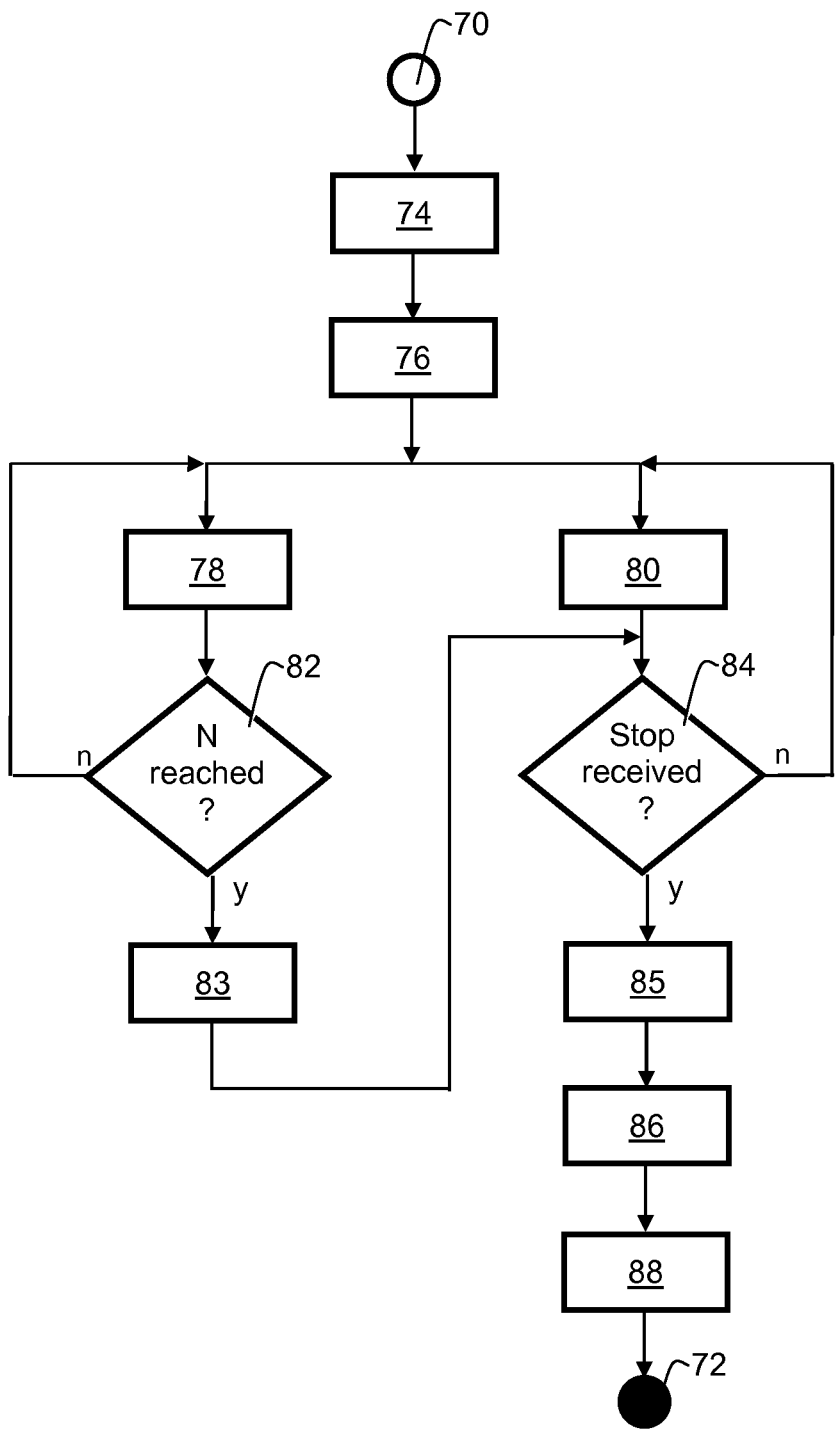
FIG. 4 schematically shows a flowchart of a second example of an embodiment of a method for on-die voltage difference measurement on a pass device.

Referring to FIG. 4, a flowchart of a second example of an embodiment of a method for on-die voltage difference measurement on a pass device is schematically shown. The method shown in FIG. 4 also allows implementing the advantages and characteristics of the described system 12 as shown, for example, in FIG. 1, as part of a method for on-die voltage difference measurement on a pass device. The method may comprise a start state 70 and may or may not be repeated after reaching the end state 72. After the start 70 the method may comprise determining 74 an offset between the first and the second counter circuits while no current flows between the first and the second terminal of the pass device. The determined offset may either be used for differently initializing the first and second counter circuits or may be used when evaluating the second counter value in block 86. After determining the offset, a start signal may be provided 76 to the first counter circuit receiving the first output signal from the first VCO circuit connected to the first terminal o the pass device and also to the second counter circuit receiving the second output signal from the second VCO circuit connected to the second terminal. The method may comprise simultaneously counting 78 oscillation periods of the first output signal and incrementing the first counter circuit and counting 80 oscillation periods of the second output signal and incrementing the second counter circuit. It should be noted that in other embodiments one or more of the counters may not be incremented but decremented when counting oscillation periods. The counting 78 of oscillation periods of the first output signal may be continued until a predefined number N of oscillation periods is reached. Once N is reached, a stop signal may be generated 83 and signalled to the second counter circuit. Counting 80 of oscillation periods of the second output signal may be continued until the stop signal is received 84. On reception of the stop signal the second counter circuit may be stopped 85 and the counter value of the second counter may be determined 86 and be used to calculate 88 a voltage difference between the voltage levels at the first and the second terminals. This calculation may take into account the difference of the counter value and N as well as the offset value initially determined in block 74.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the first VCO circuit 16 and the first counter circuit 28 may be provided as a single circuitry.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the pass device 14 and the system 12 may be located within the same device. Alternatively, the examples may be implemented as any number of separate integrated circuits or separate devices interconnected with each other in a suitable manner. For example, the controller unit 40 may be provided separately from the remaining parts of the system 12.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A system for on-die voltage difference measurement on a pass device, comprising
 a first voltage controlled oscillator circuit having a first voltage control input connected to an input terminal of said pass device;
 a second voltage controlled oscillator circuit having a second voltage control input connected to an output terminal of said pass device;
 a first counter circuit arranged to count oscillation periods of a first output signal from said first voltage controlled oscillator circuit and to provide a stop signal when a predefined number of said oscillation periods of said first output signal is counted;

a second counter circuit arranged to count oscillation periods of a second output signal from said second voltage controlled oscillator circuit and to stop counting depending on said stop signal;

a control unit arranged to receive a counter value of said second counter circuit when said second counter circuit stops counting, wherein said control unit is arranged to determine from said counter value of said second counter circuit a voltage difference between said first terminal and said second terminal.

2. The system as claimed in claim 1, wherein said first and second voltage controlled oscillator circuits are ring oscillator circuits.

3. The system as claimed in claim 1 wherein said first voltage controlled oscillator circuit at least comprises a first circuit portion generated together with a second circuit portion of said second voltage controlled oscillator circuit using a layout matched circuit design technique.

4. The system as claimed in claim 1 wherein said first counter circuit and said second counter circuit are arranged to receive a same start signal.

5. The system as claimed in claim 1 wherein said first counter circuit and said second counter circuit are ripple counter circuits.

6. The system as claimed in claim 1, wherein said stop signal is provided from said first counter circuit to said second counter circuit via a connection comprising a synchronization circuit.

7. The system as claimed in claim 1 wherein said control unit is arranged to determine said voltage difference depending on an offset value between said first counter circuit and said second counter circuit.

8. An integrated circuit for on-die voltage difference measurement on a pass device, comprising:

a first voltage controlled oscillator circuit having a first voltage control input connected to an input terminal of said pass device;

a second voltage controlled oscillator circuit having a second voltage control input connected to an output terminal of said pass device;

a first counter circuit arranged to count oscillation periods of a first output signal from said first voltage controlled oscillator circuit and to provide a stop signal when a predefined number of said oscillation periods of said first output signal is counted;

a second counter circuit arranged to count oscillation periods of a second output signal from said second voltage controlled oscillator circuit and to stop counting depending on said stop signal;

a control unit arranged to receive a counter value of said second counter circuit when said second counter circuit stops counting, wherein said control unit is arranged to determine from said counter value of said second counter circuit a voltage difference between said first terminal and said second terminal.

9. The integrated circuit as claimed in claim 8 wherein said input terminal and said output terminal are connected to supply lines of said pass device.

10. The integrated circuit as claimed in claim 8 wherein said input and output terminals are not exposed to pins of said integrated circuit.

11. The integrated circuit as claimed in claim 8 wherein said pass device is a power switching device.

12. A method for on-die voltage difference measurement on a pass device, comprising providing, by a first voltage controlled oscillator circuit connected to an input terminal of said pass device, a first output signal to a first counter circuit;

providing, by a second voltage controlled oscillator circuit connected to an output terminal of said pass device, a second output signal to a second counter circuit;

counting, by said first counter circuit, oscillation periods of said first output signal;

counting, by said second counter circuit, oscillation periods of said second output signal;

providing a stop signal to said second counter circuit when a predefined number of said oscillation periods of said first output signal is counted;

stop counting of said second counter circuit depending on said stop signal;

receiving a counter value of said second counter circuit when said second counter circuit stops counting, determining from said counter value of said second counter circuit a voltage difference between said input terminal and said output terminal.

* * * * *